(12) United States Patent
Liu et al.

(10) Patent No.: US 12,346,031 B2
(45) Date of Patent: Jul. 1, 2025

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventors: Fei Liu, Eindhoven (NL); Jin Lian, Eindhoven (NL); Zhuangxiong Huang, Eindhoven (NL); Laurentius Cornelius De Winter, Vessem (NL); Frank Staals, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 187 days.

(21) Appl. No.: 18/018,065

(22) PCT Filed: Jul. 6, 2021

(86) PCT No.: PCT/EP2021/068589
§ 371 (c)(1),
(2) Date: Jan. 26, 2023

(87) PCT Pub. No.: WO2022/022949
PCT Pub. Date: Feb. 3, 2022

(65) Prior Publication Data
US 2023/0305407 A1  Sep. 28, 2023

(30) Foreign Application Priority Data
Jul. 28, 2020  (EP) .................................... 20188032

(51) Int. Cl.
*G03F 7/00* (2006.01)
*G01N 21/47* (2006.01)

(52) U.S. Cl.
CPC ..... *G03F 7/70641* (2013.01); *G01N 21/4738* (2013.01); *G01N 21/4788* (2013.01); *G03F 7/706851* (2023.05)

(58) Field of Classification Search
CPC ............ G01N 21/4738; G01N 21/4788; G03F 1/44; G03F 7/70641; G03F 7/70683; G03F 7/706851; G03F 7/70091; G03F 9/7026
See application file for complete search history.

(56) References Cited

U.S. PATENT DOCUMENTS 8,947,639 B2   2/2015  Shibazaki
2006/0033921 A1  2/2006  Den Boef et al.
(Continued)

FOREIGN PATENT DOCUMENTS

EP   3 492 984 A1   6/2019
TW   2017-38667 A   11/2017
(Continued)

OTHER PUBLICATIONS

International Search Report and Written Opinion of the International Searching Authority directed to related International Patent Application No. PCT/EP2021/068589, mailed Oct. 20, 2021; 11 pages.
(Continued)

*Primary Examiner* — David P Porta
*Assistant Examiner* — Miya Downing
(74) *Attorney, Agent, or Firm* — Sterne, Kessler, Goldstein & Fox P.L.L.C.

(57) ABSTRACT

Disclosed is a method for focus measurement of a lithographic process. The method comprises receiving a substrate on which a metrology pattern has been printed with a lithographic apparatus with an illumination pupil, illuminating the metrology pattern with a metrology tool to measure a signal based on radiation scattered by the metrology
(Continued)

pattern, and determining or monitoring a focus of the lithographic process based on the measured signal. Position of at least part of the metrology pattern is focus dependent. At least part of the metrology pattern has been printed by the lithography apparatus with an angular asymmetric illumination pupil.

13 Claims, 7 Drawing Sheets

(56) References Cited

U.S. PATENT DOCUMENTS

| | | |
|---|---|---|
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2017/0045826 A1 | 2/2017 | Lee et al. |
| 2017/0176870 A1 | 6/2017 | Hinnen et al. |
| 2019/0056673 A1 | 2/2019 | Li et al. |
| 2019/0171114 A1* | 6/2019 | Staals ................. G03F 7/70641 |
| 2020/0103766 A1* | 4/2020 | Lee ....................... G03F 9/7026 |

FOREIGN PATENT DOCUMENTS

| | | |
|---|---|---|
| WO | WO 2010/076232 A2 | 7/2010 |
| WO | WO 2013/178422 A1 | 12/2013 |
| WO | WO 2020/104114 A1 | 5/2020 |

OTHER PUBLICATIONS

Korean Request for the Submission of an Opinion directed to Korean Patent Application No. 10-2023-7003162, mailed Mar. 20, 2025; 16 pages.

\* cited by examiner

METHODS AND PATTERNING DEVICES AND APPARATUSES FOR MEASURING FOCUS PERFORMANCE OF A LITHOGRAPHIC APPARATUS, DEVICE MANUFACTURING METHOD

CROSS-REFERENCE TO RELATED APPLICATIONS

This application claims priority of EP application 20188032.5, which was filed on 28 Jul. 2020 and which is incorporated herein its entirety by reference.

FIELD

The present invention relates to inspection apparatus and methods usable, for example, to perform metrology in the manufacture of devices by lithographic techniques. The invention further relates to such methods for monitoring a focus parameter in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Diffraction-based overlay metrology/inspection using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A1, US20120123581A1, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy (exposure dose) settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Current test structure designs and focus measuring methods have a number of drawbacks. Known focus metrology targets require sub-resolution features and/or grating structures with large pitches. Such structures may contravene design rules of the users of lithographic apparatuses. Asymmetry in a grating structure can be measured effectively using high-speed metrology apparatus (may also be called inspection apparatus) such as a scatterometer, working at visible radiation wavelengths. Known focus measuring techniques exploit the fact that focus-sensitive asymmetry can be introduced into structures printed in a resist layer by special design of the patterns on a patterning device that defines the target structure. For extreme ultraviolet (EUV) lithography, where printing is performed using radiation of a wavelength less than 20 nm, for example 13.5 nm, the creation of sub-resolution features becomes even more difficult. For EUV lithography, resist thickness, and therefore the thickness of target structures, is smaller. This weakens the diffraction efficiency, and hence the signal strength, available for focus metrology.

For these reasons, there is a need to develop new techniques for the measurement of focus performance in lithographic processes, particularly in EUV lithography, but also for projection-based lithography in general.

SUMMARY

According to an aspect of the current disclosure, there is provided a method for focus measurement of a lithographic process. The method comprises receiving a substrate on which a metrology pattern has been printed with a lithographic apparatus with an illumination pupil, illuminating the metrology pattern with a metrology tool to measure a signal based on radiation scattered by the metrology pattern, and determining or monitoring a focus of the lithographic process based on the measured signal. Position of at least part of the metrology pattern is focus dependent. At least part of the metrology pattern has been printed by the lithography apparatus with an angular asymmetric illumination pupil.

Optionally, the metrology tool is a scatterometer, optionally an angle-resolved scatterometer.

Optionally, the metrology tool measures a dark-field imaging.

Optionally, the metrology tool measures the dark-field imaging of diffraction orders diffracted the metrology pattern.

Optionally, the step of receiving the substrate comprises receiving the substrate on which the metrology pattern has been printed with extreme ultraviolet radiation Optionally, the metrology pattern comprises a periodic structure and a periodic intermediate structure, wherein the periodic structure and the intermediate structure are different, and form staggered pattern.

Optionally, the signal comprises information on at least one of an intensity and phase difference in opposing higher diffraction orders, optionally in −1 and +1 diffraction orders.

Optionally, the metrology pattern comprises a first sub-target and a second sub-target wherein the first sub-target and the second sub-target are printed by the lithography apparatus with different angular asymmetric illumination pupils.

Optionally, the metrology pattern comprises a first part and a second part wherein positions of the first part and the second part have different shifts through focus.

Optionally, the metrology pattern comprises a first sub-target and a second sub-target wherein the first sub-target and the second sub-target are printed by the lithography apparatus with the same angular asymmetric illumination pupils.

Optionally, the metrology pattern at least partly overlays with a periodic structure wherein the periodic structure is at a different layer on the substrate than a layer of the metrology pattern.

Optionally, the metrology pattern comprises an angular symmetric structure.

The invention yet further provides a computer program comprising processor readable instructions which, when run on suitable processor-controlled apparatus, cause the processor-controlled apparatus operable to perform the first aspect.

The invention yet further provides a lithographic cell operable to perform the first aspect.

The invention yet further provides a substrate with a structure. The structure is a metrology pattern for determining or monitoring a focus of a lithographic process based on a signal based on radiation scattered by the metrology pattern and measured by a metrology tool, wherein position of at least part of the metrology pattern is focus dependent; wherein at least part of the metrology pattern has been printed by a lithography apparatus with an angular asymmetric illumination pupil.

The invention yet further provides a patterning device with a structure. The structure is such that when printed onto a substrate, a metrology pattern is generated, wherein the metrology pattern is suitable for focus measurement or monitoring of a lithographic process according to the first aspect.

The invention yet further provides a metrology pattern for determining or monitoring a focus of a lithographic process based on a signal measured by a metrology tool; wherein position of at least part of the metrology pattern is focus dependent; wherein at least part of the metrology pattern has been printed by a lithography apparatus with an angular asymmetric illumination pupil.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
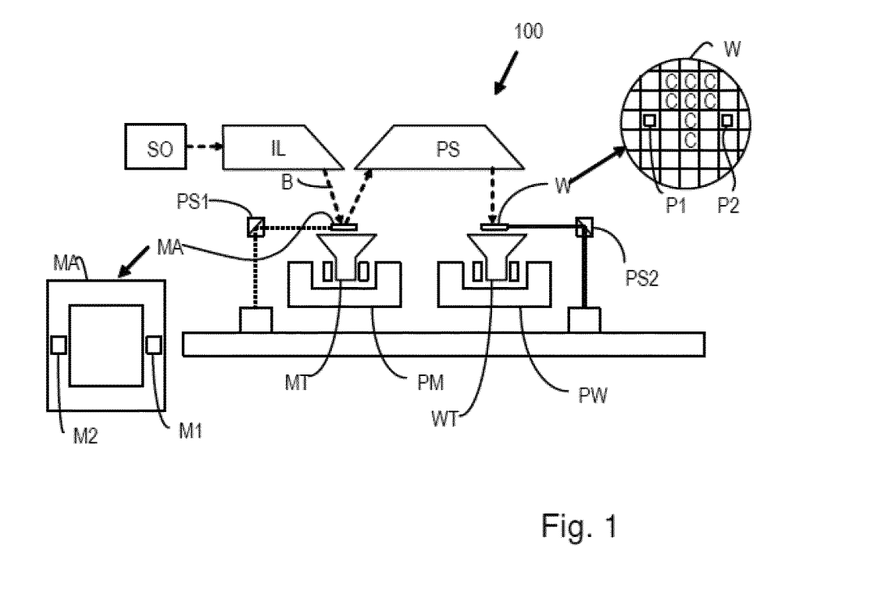
FIG. 1 depicts a lithographic apparatus having a reflective patterning device.

FIG. 1 schematically depicts a lithographic apparatus 100 including a source module SO according to one embodiment of the invention. The apparatus comprises:
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

Certain embodiments of the present disclosure exploit asymmetry in the projection system using a reflective patterning device. Other embodiments are applicable with any kind of projection system.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in an illumination pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
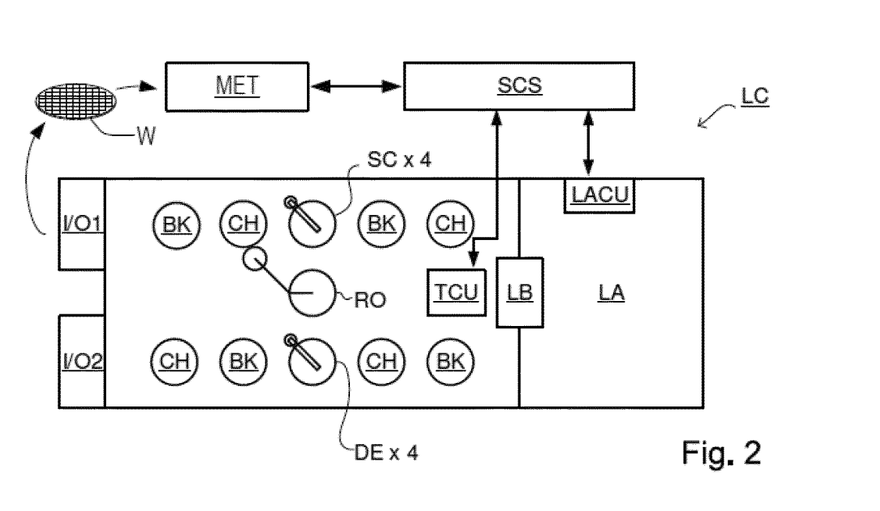
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3A:
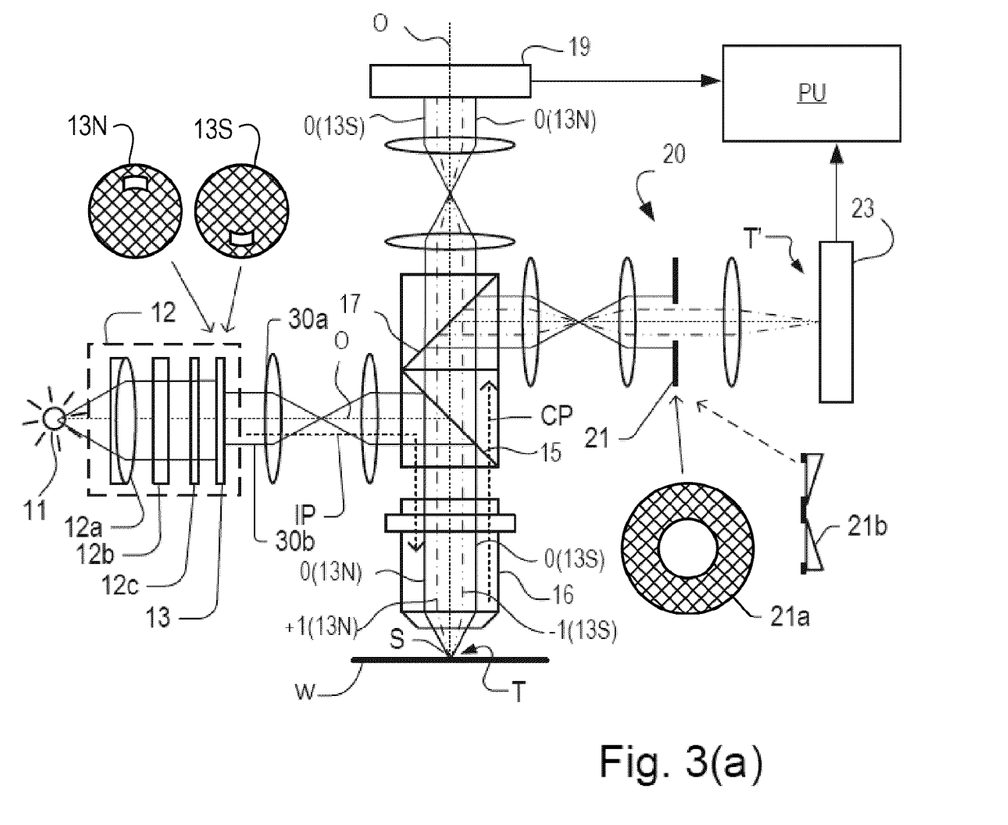
FIGS. 3(a) and 3(b) illustrate schematically an inspection apparatus adapted to perform angle-resolved scatterometry and dark-field imaging inspection methods.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-field imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19.

An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with an illumination pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

Figure 3B:
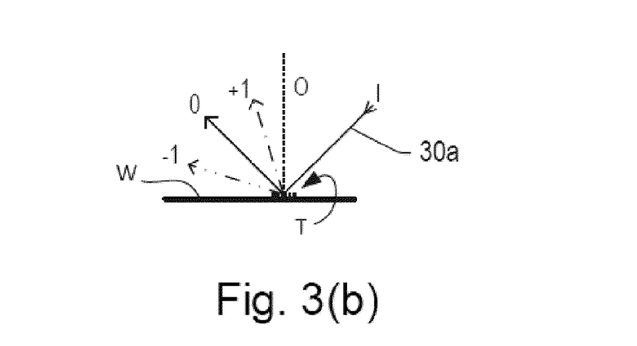

In a first example illumination mode, aperture 13N is used and rays 30a are provided so that the angle of incidence is as shown at 'I' in FIG. 3(b). The path of the zero-order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate Won sensor 23 (e.g. a CCD or CMOS sensor). An aperture stop 21 is provided in a plane in the imaging branch of the collection path CP which is conjugate to an illumination pupil plane of objective lens 16. Aperture stop 20 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

Figure 4:
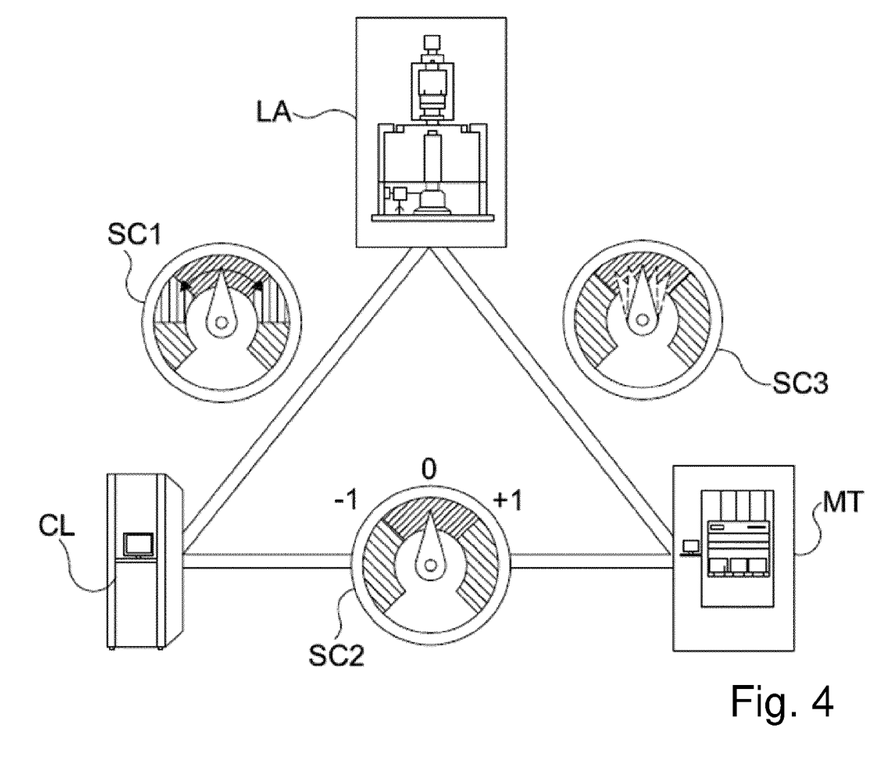
FIG. 4 depicts a schematic representation of holistic lithography, representing cooperation between three key technologies to optimize semiconductor manufacturing.

Typically the patterning process in a lithographic apparatus 100, LA is one of the most critical steps in the processing which requires high accuracy of dimensioning and placement of structures on the substrate W. To ensure this high accuracy, three systems may be combined in a so called "holistic" control environment as schematically depicted in FIG. 4. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 4 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 4 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 4 by the multiple arrows in the third scale SC3).

In the following disclosure, techniques will be illustrated for measuring focus performance of a lithographic process that uses oblique illumination on a reflective type of patterning device. These techniques may be applied in particular in EUV lithography, where reflective optics in a near-vacuum environment are required. Metrology targets including certain focus metrology patterns will be printed on the substrate, at the same time as product features are printed. Asymmetry in these printed patterns will be measured using for example diffraction-based techniques in the apparatus of FIG. 3. To allow the use of small targets, it will be assumed that these asymmetry measurements will be performed using the dark-field imaging branch of the apparatus. Diffraction-based measurements of asymmetry can also be made using the pupil imaging branch, however. Of course, the apparatus shown in FIG. 3 is only one example of an inspection apparatus and method that may be used to measure asymmetry.

In the context of lithographic apparatuses working in the DUV wavelength range, targets for diffraction-based focus (DBF) measurements have been designed and used successfully. A known type of DBF target is produced by including sub-segmented features in a grating pattern on the reticle. These features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, leading to low diffraction efficiency and difficulty extracting accurate asymmetry information from diffracted radiation in the scatterometer. In addition, since the resolution of the imaging system is inherently higher in EUV lithography, features having dimensions below the printing resolution of DUV immersion lithography become "solid" features printable by EUV lithography. To provide analogous sub-resolution features on an EUV reticle is rather impractical, and/or may violate semiconductor manufacturer's "design rules". Such rules are generally established as a means to restrict the feature designs to ensure the printed features conform to their process requirements. In any case, working outside the design rules makes it difficult to simulate the performance of the process on the DBF targets, so that the optimum target design and the calibration of focus measurements becomes a matter of trial-and-error. The desire to conform to design rules applies to DBF targets in DUV lithography, not only EUV lithography.

The focus (DBF) metrology target should have a unique, and preferably monotonic, asymmetry signal as a function of target defocus. In this context, an asymmetry signal may describe a difference (e.g., an intensity and/or phase difference) in opposing higher diffraction orders (e.g., +1 and −1 diffraction orders). It is also important that precision and sensitivity is high. Other considerations include minimizing dose and other cross talk effects (e.g., resultant from processing effects), and the tool-to-tool matching between inspection tools should be good.

Scatterometers may be used to measure several different aspects of lithographic apparatuses, for example focus and dose. The focus and dose of the radiation used in the lithographic apparatus directly affect the parameters of the patterns or structures that are exposed on the substrate. Parameters that can be measured using a scatterometer are physical properties of structures that have been printed onto a substrate such as the critical dimension (CD) or sidewall angle (SWA) of, for example, a bar-shaped structure. The critical dimension is effectively the mean width of a structure, for example, such as a bar, space, dot or hole, depending on the measured structures. The sidewall angle is the angle between the surface of the substrate and the rising or falling portion of the structure.

Focus and dose have been determined simultaneously by scatterometry, or scanning electron microscopy, from structures in the mask pattern, which gives rise to structures on the substrate, from which measurements are taken, as described in US patent application US 20110249244 A1, incorporated herein by reference in its entirety. A single structure can be used as long as that structure, when exposed and processed, has a unique combination of critical dimension and sidewall angle measurements for each point in a focus energy matrix (FEM). If these unique combinations of critical dimension and sidewall angle are available, the focus and dose values can be uniquely determined from these measurements.

The properties of the reflected radiation are compared with mathematical models or libraries from previous measurements or simulations and extrapolations of the relationship between these properties (reflected radiation, CD, SWA) and focus and/or dose related properties of the exposure apparatus.

The focus and/or dose related properties of the exposure apparatus may be focus offset (which may be caused by misalignment of lenses, for instance) or dose offset (caused by fluctuations in the intensity of the radiation beam, for instance). They may also be other focus related parameters like astigmatism, contrast or lens aberrations (typically expressed in Zernike coefficients). Alternatively, they may be illumination (i.e., radiation) parameters such as dose or intensity variation. Yet alternatively, the measured properties may be parameters that have an impact on the resist that is similar to the impact caused by dose, such as local bakeplate temperature (which gives rise to similar variations over a substrate surface in reflected radiation or CD or SWA as variations in dose over the substrate surface do) and resist variation (again, variation in resist thickness or density, etc., will give rise to variations in CD and SWA, etc., in a similar way to variations in dose).

The illuminator IL of the lithographic apparatus 100 may adjust the radiation beam B to create various radiation intensity distribution in the illumination pupil plane with components, such as facetted field and pupil mirror devices. The radiation beam B may be either off-axis or on-axis, similar as discussed for the scatterometer in FIG. 3.

Figure 5:
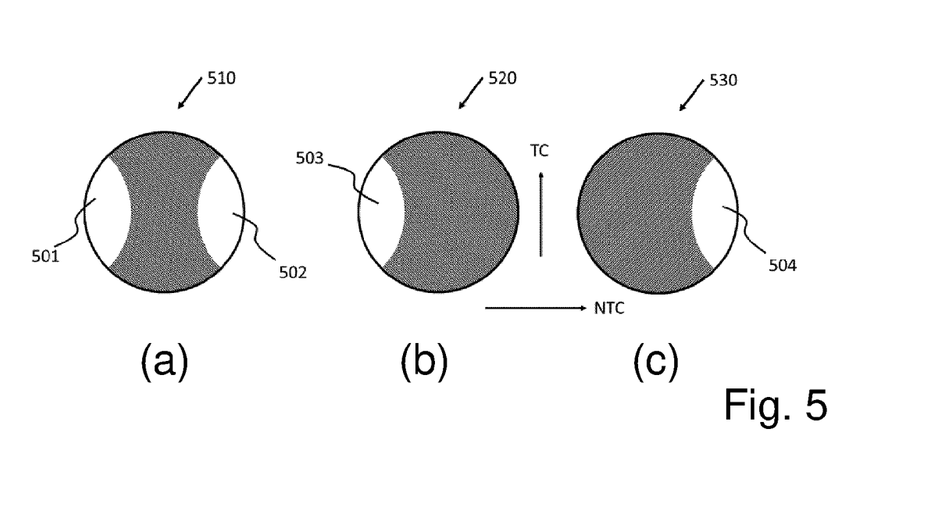
FIG. 5 shows schematically three different illumination pupils of a lithographic apparatus: (a) is dipole; (b) and (c) are monopole with opposite illumination distributions.

Two examples of the off-axis mode for projecting the image of the patterning device MA onto the substrate W are dipole and monopole as shown in FIG. 5.

With dipole mode, radiation distribution of the radiation beam B in the illumination pupil 510 comprises two off-axis areas, for example 501 and 502 as shown in FIG. 5(a). Optionally these two different areas 501 and 502 are at or close to the edge of the illumination pupil 510. Optionally the two different areas are at opposite sides of the pupil and have angular, or called rotational, symmetry about center of the pupil. The intensity distribution in the pupil may also have angular symmetry.

When the illumination beam B intensity distribution is angular asymmetric, or called rotational asymmetric, in the illumination pupil plane, the position of at least part of the printed structure may be focus dependent, which means that the focus in which the lithographic apparatus printed the structure, is related to the position where the structure is located on the wafer when the other lithographic parameters are kept unchanged. The above effect nay be used for focus metrology, which is to determine a focus value and/or monitoring a focus of the lithographic apparatus during the lithographic process by measuring the printed structures using a metrology tool. In one embodiment, within one structure, e.g. a focus target/mark, different sub-structures may have different designs, for example different pitches and/or critical dimensions (CD), and the position shifts may be pitch/CD-dependent through focus. In another embodiment, within one structure, different sub-structures may be printed by different illumination mode, i.e. different radiation intensity distribution in the illumination pupil plane, optionally different pupil angular asymmetries, and the position shifts of different sub-structures may also be different though focus. Features of the two embodiments may also be combined and used simultaneously.

One example of the modes which has pupil angular asymmetry is monopole. Monopole may be a radiation setting mode where the radiation is concentrated in single off-axis area in the illumination pupil, one example of which is monopole pupil 520 as shown in FIG. 5(b) with only one left area 503, which may be referred as left monopole. The axis TC and NTC represent two orthogonal directions in the pupil plane respectively. FIG. 5(c) shows a second example of monopole pupil which has one right area 504 which is at the opposite position of the left area 503, which may be referred as right monopole.

Another example of the modes which has pupil angular asymmetry is dipole mode with angular asymmetry over the illumination pupil plane, for example with different intensities and/or different shapes for the left monopole and the right monopole.

The transversal cross-section shape of a monopole radiation is conventionally a circle but it may also be any other distribution concentrated around the sigma center: for example, a circle, a square, a leaf, a line, etc. The intensity distribution of the monopole radiation does not need to be uniform. It may be top-hat distribution. But it may also be a collection of discrete or pixelized individual spots within the given shape.

Figure 6:
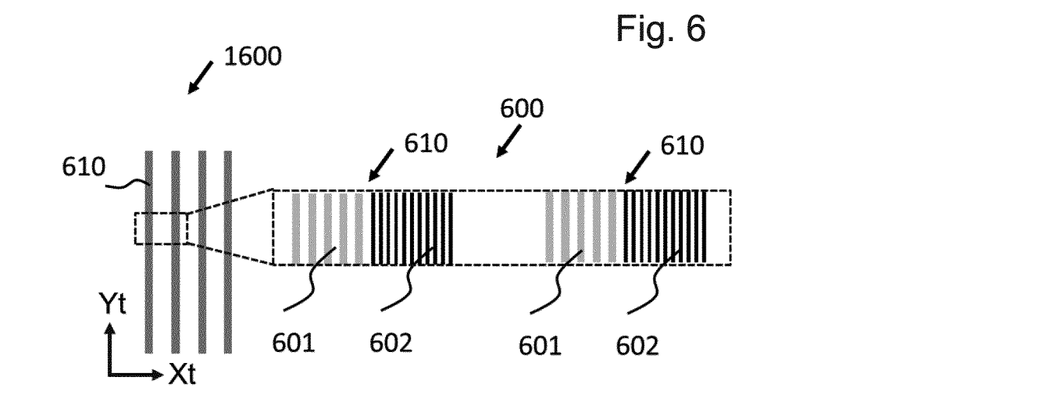
FIG. 6 shows schematically top view of a portion of an example of metrology pattern.

FIG. 6 schematically shows a metrology pattern 1600 in top view of the substrate. The metrology pattern 1600 may have periodicity in Xt direction and the repeating unit of this pattern comprises comprising lines structures or features 610 spaced in the direction of periodicity. Optionally the periodicity, which may be called pitch, is 1 μm. The line structures 610 may be straight lines extending in Yt direction. The periodicity direction may correspond to the NTC direction in FIG. 5 when the metrology pattern 1600 is printed with the lithographic apparatus. The direction of periodicity in this example may be the X direction of the patterning device and substrate, while the line feature may elongate along the Y direction. Optionally the directions Xt and Yt are perpendicular directions. Optionally each one of the line structures s may be segmented in one or more directions. For example, at least part of the line structures 610 are segmented in both Yt and Xt directions. The segmentation may be the same or different in different directions. The line structures 610 may be the same or be different in one or more of length, width or segmentation.

In one example of this embodiment shown in FIG. 6, a portion of the metrology pattern 600 is shown as a magnification of the part indicated by dotted rectangular. All or part of the line features 610 are further segmented into a first and a second segmented features 601 and 602 respectively along the same direction Yt. The segmented features 601 and 602 may be periodic in the same direction with different designs. For example, they are different in one or more of pitches, duty cycle, space width and line width. The duty cycle is defined by space width divided by pitch. The segmented features 601 and 602 form staggered pattern in their periodicity direction. All features shown in Figures may be printed by the lithographic apparatus with the same angular asymmetric pupil, for example the left monopole pupil shown in FIG. 5(b).

Figure 7:
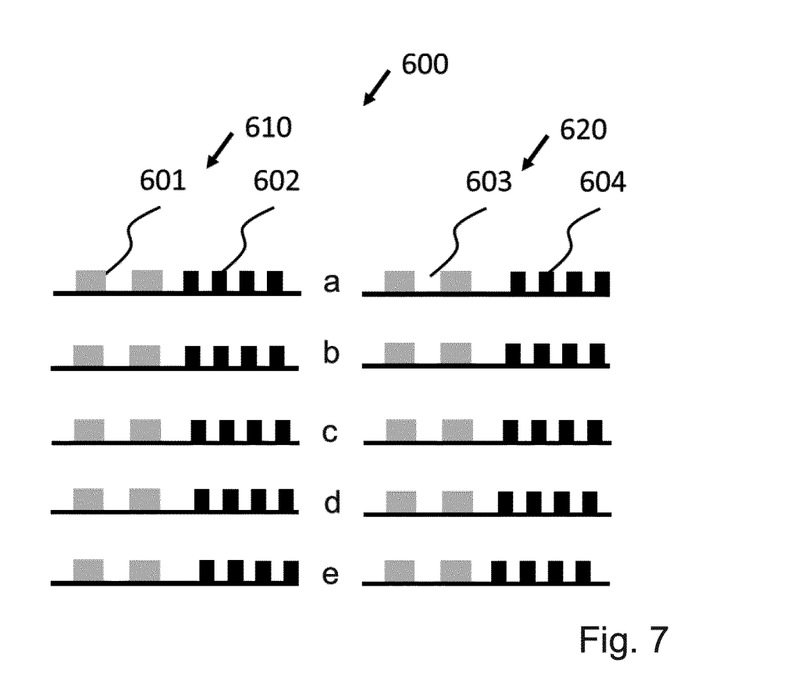
FIG. 7 shows schematically cross-sectional view of two portions of an example of metrology pattern and position shift through focus.

The segmented features 601 and 602 may have different position shifts in the direction of periodicity through focus as shown in the left part of FIG. 7, which is a side view, or called cross-sectional view, schematic. In one embodiment, position of the first segmented feature 601 does not shift through focus, while the position of the second segmented feature 602 shifts through focus. In the example shown in left part of FIG. 7, with gradually varying focus from (a) to (e), the second segmented line feature 602 gradually shifts to the right, i.e. further away from the first segmented feature 601. The focus of c may be referred as optimal focus in this example.

As can be seen in the right part of FIG. 7, the metrology pattern 600 may optionally comprise a second line features 620 which is similar or identical to the line features 610 but printed by the lithographic apparatus with a different angular asymmetric pupil, for example the right monopole pupil shown in FIG. 5(c). One or more of the features of the line structures 610 with respect to FIG. 6 may also be present in the second line features 620 as appropriate. In this embodiment, the line features 610 and the second features 620 may be referred as a first sub-target and a second sub-target respectively. When the focus is the optimal focus c, the distance between the line features 610 and the second features 620 is the same as the distance between a first segmented line feature 603 and a second segmented line feature 604, while with gradually varying focus from (a) to (e), the second segmented line feature 604 in the second line features 620 gradually shifts to the left, i.e. the opposite direction as the position shift of the second segmented line feature 602 in the first line feature 610. Although in this embodiment the first and second sub-targets are mentioned as line features, it should be noted that other features may also work as long as at least part of the first sub-target and at least part the second sub-target are printed by the lithographic apparatus with a different angular asymmetric pupil and have different position shifts through focus.

In the embodiment shown in FIG. 7, any two of the segmented line features 601, 602, 603 and 604 may be referred as a first part and a second part of the metrology pattern 1600 and positions of the first part and the second part have different shifts through focus. When the second segmented line feature 602 in the first line features 610 and the second segmented line feature 604 in the second line feature 620 are referred as a first part and a second part of the metrology pattern 1600, positions of the first part and the second part have the opposite shifts through focus.

The first and second segmented line features may be printed close enough to each other so that they are not resolved for the metrology tool. In this way, the metrology tool sees the segmented line features as an asymmetric structure and infers a focus number based on a detected signal, optionally a detected intensity asymmetry, optionally the intensity difference between diffracted +1 and −1 orders. A computer may be used to extract focus from the detected signal.

Figure 8:
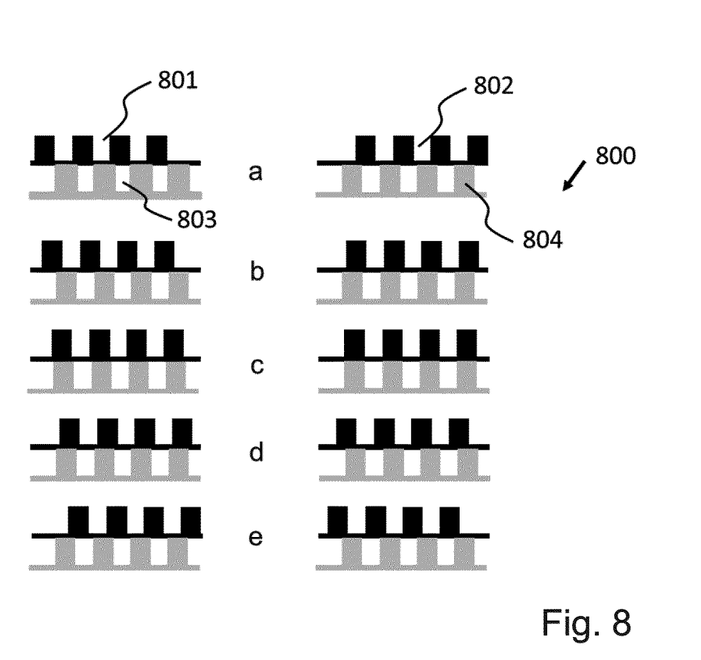
FIG. 8 shows schematically cross-sectional view of two portions of a further example of metrology pattern and position shift through focus.

FIG. 8 shows schematically a cross-sectional view of two portions of a further example of metrology pattern 800 with gradually varying focus from (a) to (e). One or more of the features of the metrology pattern 1600 with respect to FIGS. 6 and 7 may also be present in the metrology pattern 800 as appropriate. A first line feature, or sub-target, 801 and a second line feature, or sub-target, 802 of the metrology pattern 800 at least partly overlay with a periodic structure 803 and 804 respectively, wherein the periodic structures are at a different layer on the substrate than a layer of the metrology pattern 800. The first sub-target 801 and the second sub-target 802 may be periodic structures. In this embodiment, the line features 801 and 802 may be gratings at top layer, which may be referred as top gratings, and the periodic structures 803 and 804 are gratings at bottom layer, which may be referred as bottom gratings. The pitch-dependent pattern shift with respect to the bottom gratings will introduce a pattern position shift proportional to defocus. The first sub-target 801 and the second sub-target 802 may be printed by the lithography apparatus with different angular asymmetric pupils. Optionally the top gratings may have the same periodicity/periodicities as the bottom gratings. Optionally the top gratings may have different periodicities from the bottom gratings. Optionally they are printed with left monopole and right monopole respectively. Therefore the position shifts of the first sub-target 801 and the second sub-target 802 through focuses have opposite directions. In the embodiment, the first sub-target 801 and the second sub-target 802 may be referred as a first part and a second part of the metrology pattern 800.

Focus variation may introduce opposite overlays between top and bottom gratings for left and right monopole printed structures. The measured intensity asymmetries $\Delta I_L$, $\Delta I_R$ of two, optionally closely spaced, sub-targets which are printed by left and right monopole respectively can be expressed as $$\Delta I_L = K(OV_{focus} + OV_c)$$

$$\Delta I_R = K(-OV_{focus} + OV_c)$$

$$K \cdot OV_{focus} = \frac{\Delta I_L - \Delta I_R}{2}$$

where $OV_{focus}$ is a focus induced overlay and its sign may flip when illumination setting is switched to a opposite setting, for example from left monopole to right monopole, $OV_c$ is a common overlay error introduced by other means. A difference $\Delta I_L - \Delta I_R$ is directly proportional to the pattern position shift and at small focus variation scales linearly with focus drift.

$OV_{focus}$ is defocus induced overlay and proportional to focus. The K may be obtained with help of bias d, which is an introduced overlay between the top grating and the bottom grating.

$$\Delta I_L^{+d} = K(OV_{focus} + OV_c + d)$$

$$\Delta I_L^{-d} = K(OV_{focus} + OV_c - d)$$

$$\Delta I_R^{+d} = K(-OV_{focus} + OV_c + d)$$

$$\Delta I_R^{-d} = K(-OV_{focus} + OV_c - d)$$

$$OV_{focus} + OV_c = \frac{\Delta I_L^{+d} + \Delta I_L^{-d}}{\Delta I_L^{+d} - \Delta I_L^{-d}} d$$

$$-OV_{focus} + OV_c = \frac{\Delta I_R^{+d} + \Delta I_R^{-d}}{\Delta I_R^{+d} - \Delta I_R^{-d}} d$$

In another embodiment, instantaneous focus measurement may be printed by a lithographic process with only one type of exposure i.e. with only a single monopole or a dipole with angular asymmetry over the illumination pupil plane. In one embodiment, each line feature 610 comprises of two different pitches. There is a duty cycle change through focus. The intensity of scatterometer-measured diffraction order changes as duty cycle changes.

Figure 9:
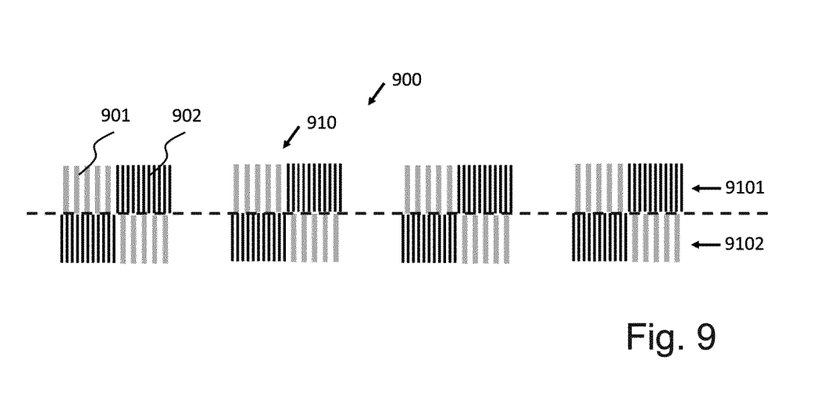
FIG. 9 shows schematically top view of a portions of a further example of metrology pattern and position shift through focus.

FIG. 9 shows schematically top view of a portions of a further example of metrology pattern 900 and its position shift through focus. One or more of the features of the metrology pattern 1600 with respect to FIGS. 6, 7 and 8 may also be present in the metrology pattern 900 as appropriate. The metrology pattern 900 comprises a first part, a first sub-target 901 and a second part, a second sub-target 902, which may be printed by the lithography apparatus with the same or different angular asymmetric illumination pupils.

Positions of the first part and the second part have different shifts through focus due to different designs. Each line feature 910 of metrology pattern 900 comprise two parts, a top structure 9101 and a bottom structure 9102 optionally printed in a single layer, as divided by the dashed line in FIG. 9. The line feature 910 is an angular symmetric structure, which enables the focus metrology measurement with only one type of exposure optionally a single monopole exposure or a dipole with angular asymmetry over the illumination pupil plane. The angular symmetric structure with one type of exposure may provide absolute focus information using the signal difference between the top and bottom structures.

Figure 10:
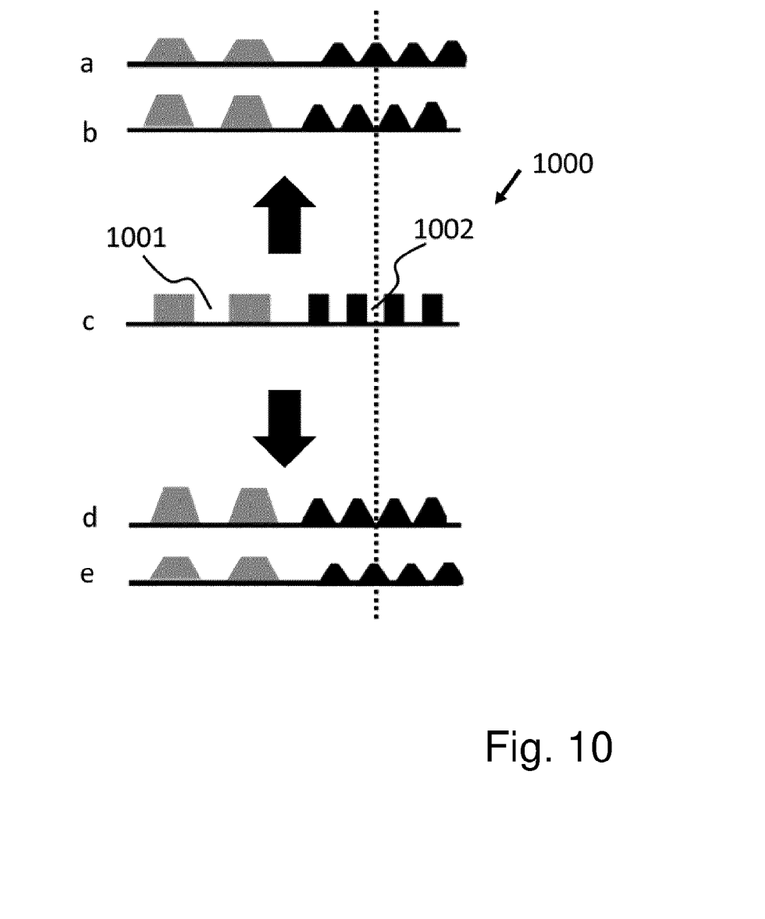
FIG. 10 shows schematically cross-sectional view of a portions of a further example of metrology pattern and position shift through focus.

FIG. 10 shows schematically cross-sectional view of a portion of a further example of metrology pattern 1000 with gradually varying focus from (a) to (e). One or more of the features of the metrology patterns with respect to FIGS. 6, 7, 8 and 9 may also be present in the metrology pattern 1000 as appropriate. The metrology pattern 1000 comprises a first segmented feature 1001 and a second segmented feature 1002, which may be the same or similar to the segmented features 601 and 602 respectively shown in FIG. 6 and FIG. 7. The features in FIG. 10 (c) are printed at a reference focus, which may be optimal focus for the lithographic process. A large defocus, for example in the situations shown in (a) and (e), in an incoherent imaging system can introduce an image reversal effect and the image reversal shows up as half-pitch relative pattern shift. When features with different pitches are printed through focus, features with some pitches show the image reversal effect while the others not. In this example, the first segmented feature 1001 with a first pitch does not show the image reversal effect within focus region (a) to (e), while the second segmented feature 1002 with a second pitch shows the image reversal effect with focuses (a) and (e), resulting in the half-pitch relative pattern shift compared with (c), which is indicated by a dotted line. Since the focus of the image reversal effect can be calculated if certain lithographic and/or feature parameters are known, for example the periodicity of the segmented feature is known, the image reversal effect can be measured by the scatterometer and used for focus metrology. In the embodiment, the first segmented feature 1001 and the second segmented feature 1002 may be referred as a first part and a second part of the metrology pattern 800. Cross section shapes of the structures may vary with different focuses, as shown in FIG. 10, the cross-section shapes for all the structures are rectangular with focus c while trapezoidal with focuses a, b, d, and e. Please note that the cross-section shapes presented herein are for illustrative purposes only while in reality the cross-section shapes may be different.

Figure 11:
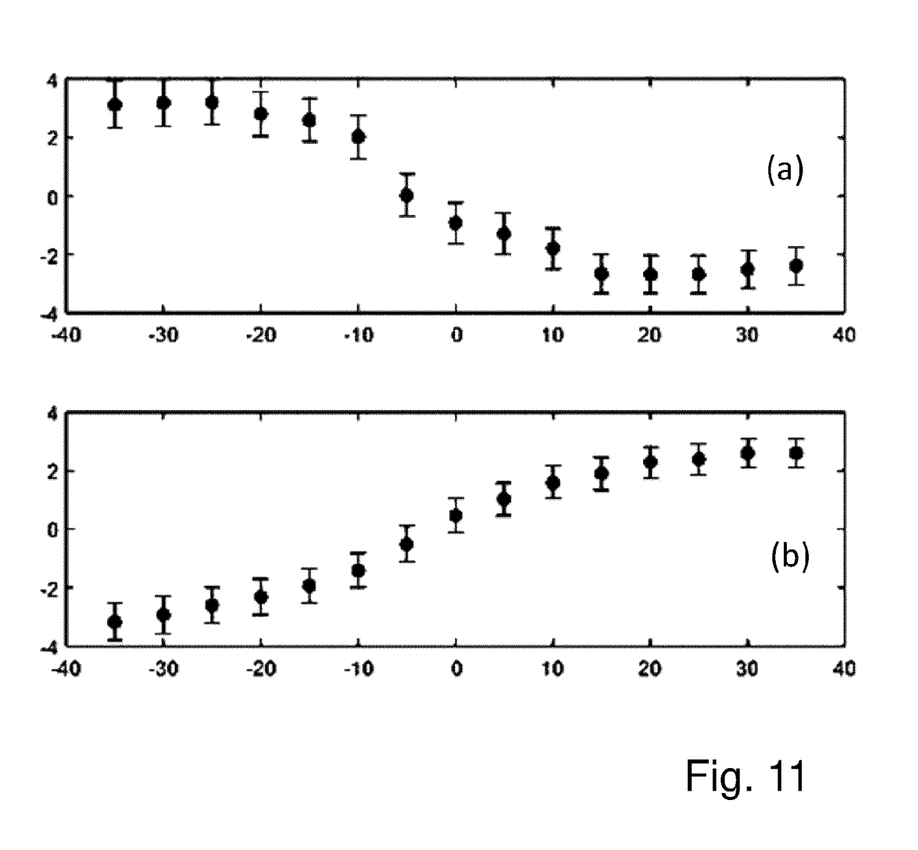
FIG. 11 is a plot of experimental result showing a position shift against focus of a lithographic apparatus for a structure.

FIG. 11 is a plot of experimental result showing a position shift, Y axis, against focus for a periodic feature, X axis, with left monopole (a) and right monopole (b) respectively. As can be seen that the opposite monopole will result in opposite position shifts for the periodic structures with varying focuses. A combination of pitches may be used to enlarge focus capture range. Based on sensitivity from the recent experimental data and the realistic metrology measurement accuracy, it is expected that the discussed embodiments will result in high accuracy.

It has been found that the measured shift due to different angular asymmetric illumination pupils match well with the simulated shift. Therefore, if different illuminations are used for exposures, the focus can also be deduced from the simulations results with different illuminations.

The position shift may depend on many parameters of the metrology pattern. It is possible to select pitches that are less critically dependent on imaging parameters of the lithographic process, but still show very large difference in through-focus pattern shift behavior printed with different pupils with angular asymmetry. For example, the different pupils with angular asymmetry may be different monopoles. For example, the different pupils with angular asymmetry may be different dipoles with asymmetric pupil.

Figure 12:
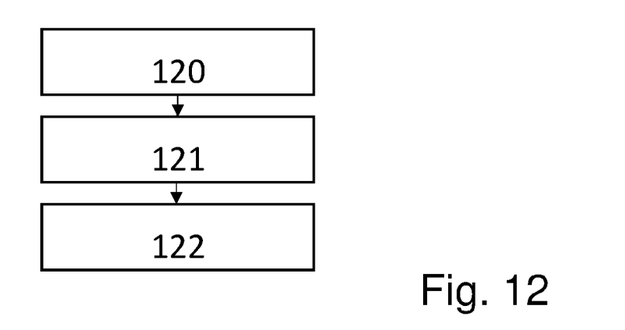
FIG. 12 is a flowchart of a method according to an embodiment of the invention.

All the above-mentioned embodiments may be used in methods for focus measurement of a lithographic process, as depicted in FIG. 12. A first step 120 is receiving a substrate on which a metrology pattern has been printed with a lithographic apparatus with an illumination pupil, wherein the metrology pattern may be one of the embodiments mentioned above. Optionally position of at least part of the metrology pattern is focus dependent. Optionally at least part of the metrology pattern has been printed by the lithography apparatus with an angular asymmetric illumination pupil. There may be a second step 121, which is illuminating the metrology pattern with a metrology tool to measure a signal which is based on radiation scattered by the metrology pattern. Optionally the metrology tool is a scatterometer, optionally an angle-resolved scatterometer. Optionally the metrology tool measures a dark-field imaging. There may be a third step 122, which is determining, or monitoring focus of the lithographic process based on the measured signal. More details on methods of focus measurement of a lithographic process are provided in the description above.

This invention may work on product for on-product focus measurement and/or control, in addition to lithographic apparatus calibration and setup. Overlay (or focus) baseliner control loop is a method used during lithographic process to reduce overlay (or focus) variation induced by stabilizing the overlay (or focus) fingerprint of a lithographic apparatus at a defined baseline via feedback or feedforward control. The embodiment shown in FIG. 8 enables converting a focus metrology into overlay metrology and provides an opportunity to potentially combine the overlay and focus baseliner control loops, which means both overlay and focus during the lithographic process may be monitored based on overly measurement. The above-mentioned method may also be a computer program comprising processor readable instructions which, when run on suitable processor-controlled apparatus, cause the processor-controlled apparatus to perform the method above.

An example of this invention is a substrate with a first structure, wherein the first structure is a metrology pattern suitable for focus performance of a lithographic process according to any of the metrology patterns mentioned above.

Another example of this invention is a patterning device, for example a reticle or a mask, with a second structure, wherein the second structure is such that when printed onto a substrate by a lithographic apparatus the first structure is generated on the substrate. For lithographic apparatus performing with extreme ultraviolet radiation, a reflective patterning device may be used while for lithographic apparatus performing with deep ultraviolet radiation, a transmissive reticle may be used instead.

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

While the target structures and metrology patterns described above are metrology targets specifically designed and formed for the purposes of measurement, in other embodiments, properties may be measured on targets which are functional parts of devices formed on the substrate. Many devices have regular, grating-like structures. The terms "metrology pattern" and "metrology target" and the like as used herein do not require that the structure has been provided specifically for the measurement being performed.

Further embodiments are disclosed in the subsequent clauses:

1. A method for focus measurement of a lithographic process, the method comprising:
   receiving a substrate on which a metrology pattern has been printed with a lithographic apparatus with an illumination pupil,
   illuminating the metrology pattern with a metrology tool to measure a signal based on radiation scattered by the metrology pattern, and
   determining or monitoring a focus of the lithographic process based on the measured signal; wherein position of at least part of the metrology pattern is focus dependent;
   wherein at least part of the metrology pattern has been printed by the lithography apparatus with an angular asymmetric illumination pupil.

2. A method according to clause 1, wherein the metrology tool is a scatterometer, optionally an angle-resolved scatterometer.

3. A method according to any proceeding clause, wherein the metrology tool measures a dark-field imaging.

4. A method according to clause 3, wherein the metrology tool measures the dark-field imaging of diffraction orders diffracted the metrology pattern.

5. A method according to any proceeding clause, wherein the step of receiving the substrate comprises receiving the substrate on which the metrology pattern has been printed with extreme ultraviolet radiation 6. A method according to any proceeding clause, wherein the metrology pattern comprises a periodic structure and a periodic intermediate structure, wherein the periodic structure and the intermediate structure are different, and form staggered pattern.

7. A method according to any proceeding clause, wherein the signal comprises information on at least one of an intensity and phase difference in opposing higher diffraction orders, optionally in −1 and +1 diffraction orders.

8. A method according to any proceeding clause, wherein the metrology pattern comprises a first sub-target and a second sub-target wherein the first sub-target and the second sub-target are printed by the lithography apparatus with different angular asymmetric illumination pupils.

9. A method according to any of clauses 1 to 7, wherein the metrology pattern comprises a first part and a second part wherein positions of the first part and the second part have different shifts through focus.

10. A method according to any of clauses 1 to 7, wherein the metrology pattern comprises a first sub-target and a second sub-target, wherein the first sub-target and the second sub-target have different designs, wherein the first sub-target and the second sub-target are printed by the lithography apparatus with the same angular asymmetric illumination pupils.

11. A method according to any proceeding clause, wherein the metrology pattern at least partly overlays with a periodic structure wherein the periodic structure is at a different layer on the substrate than a layer of the metrology pattern.

12. A method according to any proceeding clause, wherein the metrology pattern comprises an angular symmetric structure.

13. A method for focus measurement of a lithographic process, the method comprising:
   receiving a substrate on which a metrology pattern has been printed with a lithographic apparatus with an illumination pupil,
   illuminating the metrology pattern with a metrology tool to measure a signal based on radiation scattered by the metrology pattern, and
   determining or monitoring a focus of the lithographic process based on the measured signal; wherein the metrology pattern comprises a first part and a second part;
   wherein the first part has a first position shift through focus and the second part has a second position shift through focus;
   wherein the first position shift and the second position shift are different.

14. A method according to clause 18, wherein at least part of the metrology pattern has been printed by the lithography apparatus with an angular asymmetric illumination pupil.

15. A computer program comprising processor readable instructions which, when run on suitable processor-controlled apparatus, cause the processor-controlled apparatus to perform the method of any of clauses 1 to 14.

16. A patterning device with a structure, wherein the structure is such that when printed onto a substrate, a metrology pattern is generated, wherein the metrology pattern is suitable for focus measurement or monitoring of a lithographic process according to any of clauses 1 to 14.

17. A lithographic cell being operable to perform the method of any of clauses 1 to 14.

18. A substrate with a structure, wherein the structure is a metrology pattern for determining or monitoring a focus of a lithographic process based on a signal based on radiation scattered by the metrology pattern and measured by a metrology tool;
   wherein position of at least part of the metrology pattern is focus dependent;
   wherein at least part of the metrology pattern has been printed by a lithography apparatus with an angular asymmetric illumination pupil.

19. A metrology pattern for determining or monitoring a focus of a lithographic process based on a signal measured by a metrology tool;
   wherein position of at least part of the metrology pattern is focus dependent;
   wherein at least part of the metrology pattern has been printed by a lithography apparatus with an angular asymmetric illumination pupil.

The substrates on which these metrology patterns are formed may be production wafers or experimental wafers in product development. They may also be dedicated metrology wafers, for example monitor wafers which are processed intermittently as part of an advance process control (APC) mechanism.

In association with the physical grating structures defining the metrology patterns as realized on substrates and patterning devices, an embodiment may include a computer program containing one or more sequences of machine-readable instructions describing a method of designing metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

It is desirable to provide a method and apparatus for metrology using a target, in which throughput, flexibility and/or accuracy can be improved. Furthermore, although not limited to this, it would be of great advantage, if this could be applied to target structures that can be read out with a dark-field image-based technique, bright-field image-based technique, or bright-field pupil-based technique.

The breadth and scope of the present invention should not be limited by any of the above-described exemplary embodiments, but should be defined only in accordance with the following claims and their equivalents.

The invention claimed is:

1. A method comprising:
   printing, on a substrate, a metrology pattern comprising a first sub-target and a second sub-target with a lithographic apparatus using respective first and second angular asymmetric illumination pupils,
   receiving the substrate at a metrology tool,
   illuminating the metrology pattern with the metrology tool to measure a signal based on radiation scattered by the metrology pattern, and
   determining or monitoring a focus of a lithographic process based on the measured signal;
   wherein a position of at least part of the metrology pattern is focus dependent.

2. The method of claim 1, wherein the metrology tool is a scatterometer or an angle-resolved scatterometer.

3. The method of claim 1, wherein the metrology tool measures a dark-field imaging or dark-field imaging of diffraction orders diffracted from the metrology pattern.

4. The method of claim 1, wherein the receiving comprises receiving the substrate on which the metrology pattern has been printed with extreme ultraviolet radiation.

5. The method of claim 1, wherein:
   the metrology pattern comprises a periodic structure and a periodic intermediate structure, and
   the periodic structure and the periodic intermediate structure are different and form a staggered pattern.

6. The method of claim 1, wherein the signal comprises information on at least one of an intensity and phase difference in opposing higher diffraction orders or in −1 and +1 diffraction orders.

7. The method of claim 1, wherein:
   the metrology pattern comprises a first part and a second part, and
   positions of the first part and the second part have different shifts through focus.

8. The method of claim 1, wherein
   the first sub-target and the second sub-target are different in one or more of pitches, critical dimensions, duty cycles, space widths, or line widths.

9. The method of claim 1, wherein:
   the metrology pattern at least partly overlays with a periodic structure, and
   the periodic structure is at a different layer on the substrate than a layer of the metrology pattern.

10. The method of claim 1, wherein the metrology pattern comprises an angular symmetric structure.

11. A computer program comprising processor readable instructions that, when run on suitable processor-controlled apparatus, cause the processor-controlled apparatus to perform a method for focus measurement of a lithographic process, the method comprising:
    receiving a substrate on which a metrology pattern comprising a first sub-target and a second sub-target has been printed with a lithographic apparatus using respective first and second angular asymmetric illumination pupils;
    illuminating the metrology pattern with a metrology tool to measure a signal based on radiation scattered by the metrology pattern; and
    determining or monitoring a focus of the lithographic process based on the measured signal,
    wherein a position of at least part of the metrology pattern is focus dependent.

12. A patterning device comprising:
    a structure that, when printed onto a substrate, generates a metrology pattern suitable for focus measurement or monitoring of a lithographic process, the metrology pattern comprising a first sub-target and a second sub-target printed with a lithographic apparatus using respective first and second angular asymmetric illumination pupils and being configured to:
    illuminate the metrology pattern with a metrology tool to measure a signal based on radiation scattered by the metrology pattern; and
    determine or monitor a focus of the lithographic process based on the measured signal,
    wherein a position of at least part of the metrology pattern is focus dependent.

13. A device comprising:
    a metrology pattern comprising a first sub-target and a second sub-target printed with a lithographic apparatus using respective first and second angular asymmetric illumination pupils and configured to determine or monitor a focus of a lithographic process based on a signal measured by a metrology tool,
    wherein a position of at least part of the metrology pattern is focus dependent.

* * * * *